US007207015B1

(12) United States Patent
Ballagh et al.

(10) Patent No.: US 7,207,015 B1
(45) Date of Patent: Apr. 17, 2007

(54) TRANSLATION OF AN ELECTRONIC INTEGRATED CIRCUIT DESIGN INTO HARDWARE

(75) Inventors: Jonathan B. Ballagh, Longmont, CO (US); Roger B. Milne, Boulder, CO (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 414 days.

(21) Appl. No.: 10/618,037

(22) Filed: Jul. 11, 2003

(51) Int. Cl.
*G06F 17/50* (2006.01)
(52) U.S. Cl. .............................. 716/3; 716/2
(58) Field of Classification Search .......... 716/2, 716/3
See application file for complete search history.

(56) References Cited

U.S. PATENT DOCUMENTS 5,473,546 A * 12/1995 Filseth ..................... 716/8
5,610,832 A * 3/1997 Wikle et al. ............... 716/11
6,684,381 B1 * 1/2004 Bening et al. .............. 716/18

* cited by examiner

*Primary Examiner*—Jack Chiang
*Assistant Examiner*—Brandon Bowers
(74) *Attorney, Agent, or Firm*—W. Eric Webostad; Robert Brush (57) ABSTRACT

Translation of an electronic design of an integrated circuit into circuit description language is described. In an example, a connection among circuit descriptions representing behavior of circuit elements in the electronic design is identified. The connection is associated with an identifier. The electronic design is then translated into a circuit description language representation, where the connection is implemented within the circuit description language representation using the identifier. In another example, an implicit circuit description representing behavior of circuit elements within the electronic design are identified. Explicit circuit descriptions within the electronic design are augmented with an addition circuit description. The electronic design is then translated into a circuit description language representation.

23 Claims, 7 Drawing Sheets

TRANSLATION OF AN ELECTRONIC INTEGRATED CIRCUIT DESIGN INTO HARDWARE

FIELD OF THE INVENTION

One or more aspects of the invention relate generally to electronic integrated circuit design and, more particularly, to translating a design of an electronic integrated circuit into hardware.

BACKGROUND OF THE INVENTION

Many tools allow electronic integrated circuit (IC) designs to be assembled, simulated, debugged, and translated into hardware. In particular, this can be done in an electronic design tool (EDT) known as a high-level modeling system (HLMS). An HLMS allows a user to construct and debug a design in a high level and abstract setting and then automatically translates the design into low level hardware. The high level design consists of blocks, ports, signals, and levels of hierarchy; there are translated into concrete blocks, ports, signals, and levels of hierarchy in a hardware description language such as VHDL or Verilog. The portion of the HLMS that does the translating is called a "compiler", and the translation process is known as "compiling".

To achieve a high level of abstraction, an HLMS typically hides low level aspects of a design that are nevertheless required for the design to function properly in hardware. For example, clock ports and signals may only be implicit in the high level design, but must be explicit in hardware. Similarly, gateways (i.e., blocks through which signals are imported into a design, and exported to the outside) can be positioned anywhere in a high level design, but in hardware become top level input and output ports.

It is desirable and useful to have mechanisms that simplify compilation. These mechanisms must allow aspects of the high level design that are at best implicit and at worst entirely missing to be translated into concrete hardware blocks, ports, and connections. The mechanisms must also allow hardware blocks, ports, and connections to be positioned far from the locations they occupied in the high level design.

SUMMARY OF THE INVENTION

Translation of an electronic design of an integrated circuit into circuit description language is described. In an embodiment, a connection among circuit descriptions representing behavior of circuit elements in the electronic design is identified. The connection is associated with an identifier. The electronic design is then translated into a circuit description language representation, where the connection is implemented within the circuit description language representation using the identifier.

In another embodiment, an implicit circuit description representing behavior of circuit elements within the electronic design are identified. Explicit circuit descriptions within the electronic design are augmented with an addition circuit description. The electronic design is then translated into a circuit description language representation.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Translation of an electronic design of an integrated circuit (IC) into hardware is described. One or more aspects of the invention are related to translating an electronic design of an IC implemented within a high level modeling system (HLMS) into a hardware level description. Those skilled in the art, however, will appreciate that the invention may be employed within other types of modeling systems that facilitate the design of ICs. For example, modeling systems that may be used include schematic editors that write a design as HDL, or text-based design tools that allow users to assemble a design from a library of fixed HDL blocks, as well as HDL templates.

Figure 1:
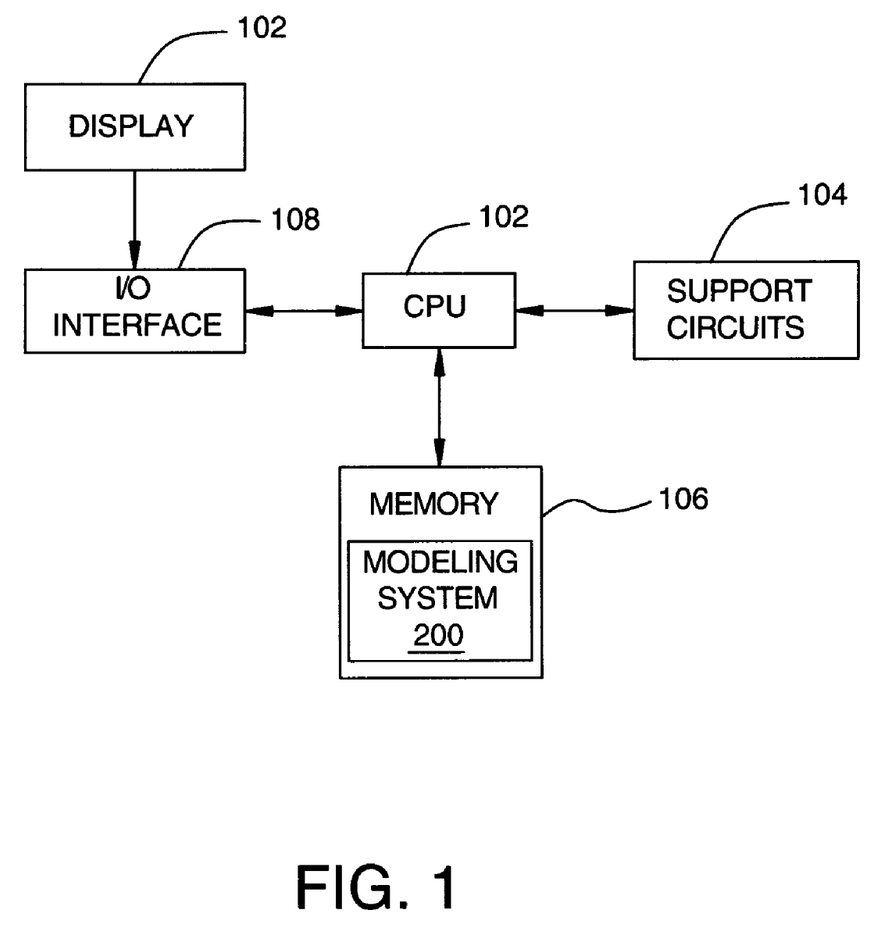
FIG. 1 is a block diagram depicting an exemplary embodiment of a computer system suitable for implementing processes and methods described herein.

FIG. 1 is a block diagram depicting an exemplary embodiment of a computer system 100 suitable for implementing processes and methods described herein. Computer system 100 includes a central processing unit (CPU) 102, memory 106, a variety of support circuits 104, and an I/O interface 108. CPU 102 may be any type of microprocessor known in the art. Support circuits 104 for CPU 102 include conventional cache, power supplies, clock circuits, data registers, I/O interfaces, and the like. I/O interface 108 may be directly coupled to memory 106 or coupled through CPU 102, and may be coupled to a conventional keyboard, network, mouse, printer, and interface circuitry adapted to receive and transmit data, such as data files and the like. I/O interface 108 may be coupled to a display 112.

Memory 106 may store all or portions of one or more programs or data to implement the processes and methods of the invention. Although exemplary embodiments of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

Computer system 100 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 106. Memory 106 may include one or more of the following random access memory, read only memory, magneto-resistive read/write memory, optical read/write memory, cache memory, magnetic read/write memory, and the like, as well as signal-bearing media as described below. Memory 106 may store all or a portion of integrated circuit modeling system 200 of FIG. 2.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 2:
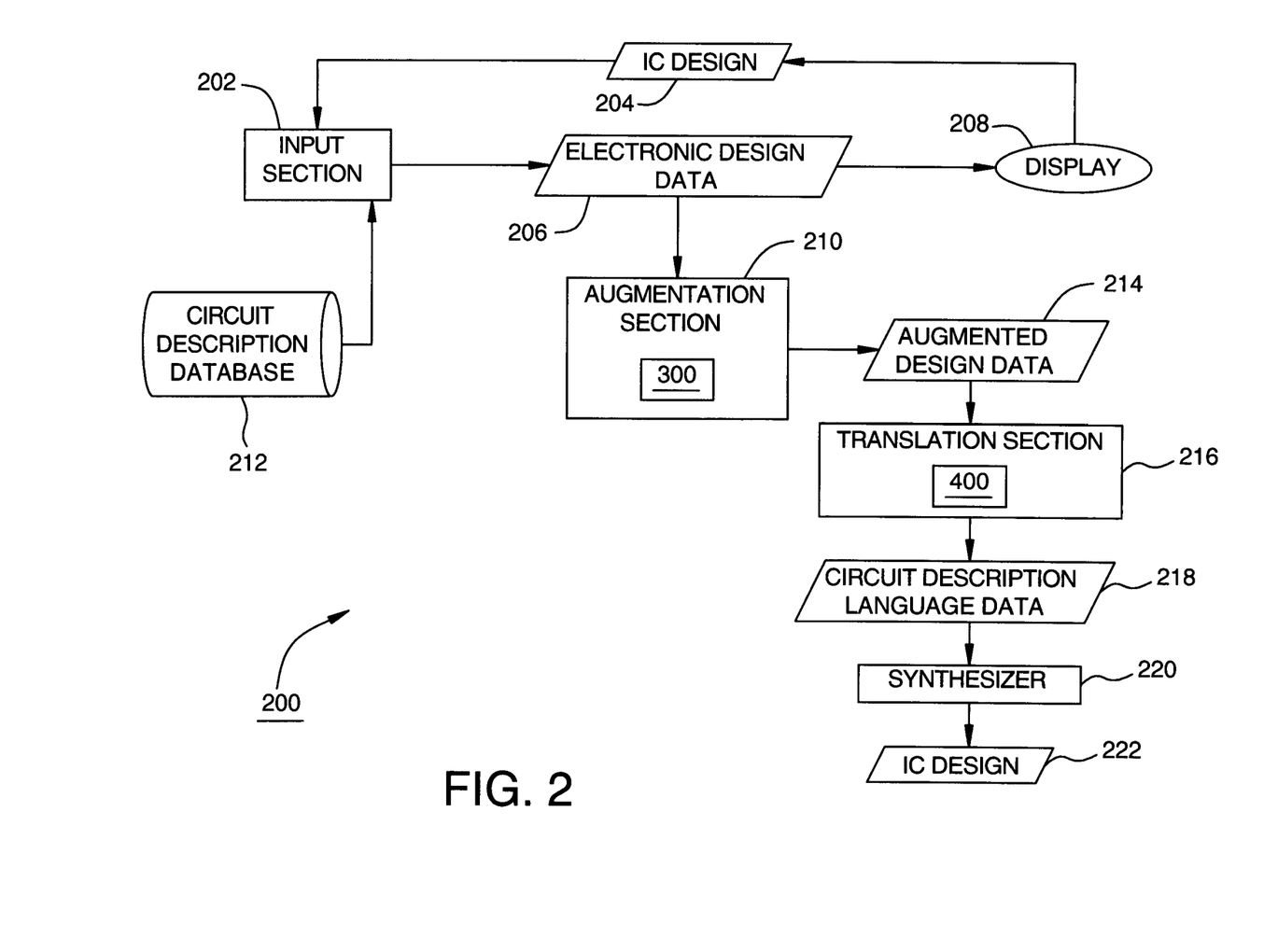
FIG. 2 is a block diagram depicting an exemplary embodiment of an integrated circuit modeling system.

FIG. 2 is a block diagram depicting an exemplary embodiment of an integrated circuit modeling system 200. Modeling system 200 includes an input section 202, a circuit description database 212, a display 208, an augmentation section 210, a translation section 216, and a synthesizer 220. Integrated circuit modeling system 200 may be implemented using computer system 100 of FIG. 1. Notably, input section 202, augmentation section 210, translation section 216, and synthesizer 220 may be all or portions of one or more programs stored within memory 106 and executed by CPU 102. An IC design 204 is input, such as at a schematic or logic level, to modeling system 200 using input section 202 and display 208. Input section 202 produces data 206 that includes an electronic representation of IC design 204 ("electronic design data 206"). Electronic design data 206 may be schematically represented on display 208.

In an embodiment, electronic design data 206 is an abstraction of IC design 204 that includes "blocks", "ports", and "nets". Blocks, or logic blocks, represent sections, having circuit elements, of IC design 204. Ports represent inputs and outputs of blocks, and nets, or networks, represent connections between various ports of various blocks. The blocks, ports, and nets of electronic design data 206 represent an abstraction of IC design 204 in a well-known manner. For example, blocks, ports, and nets are abstractions that may be produced by System Generator for DSP, commercially available from Xilinx, Inc, or other known abstraction translators. As understood by those skilled in the art, however, integrated circuit design systems may employ other types of abstractions to represent an IC design in addition to, or in place of, the above-described blocks, ports, and nets. In general, electronic design data 206 includes a plurality of circuit descriptions that represent the behavior of circuit elements of IC design 204. Such circuit descriptions may be stored in circuit description database 212.

Figure 3:
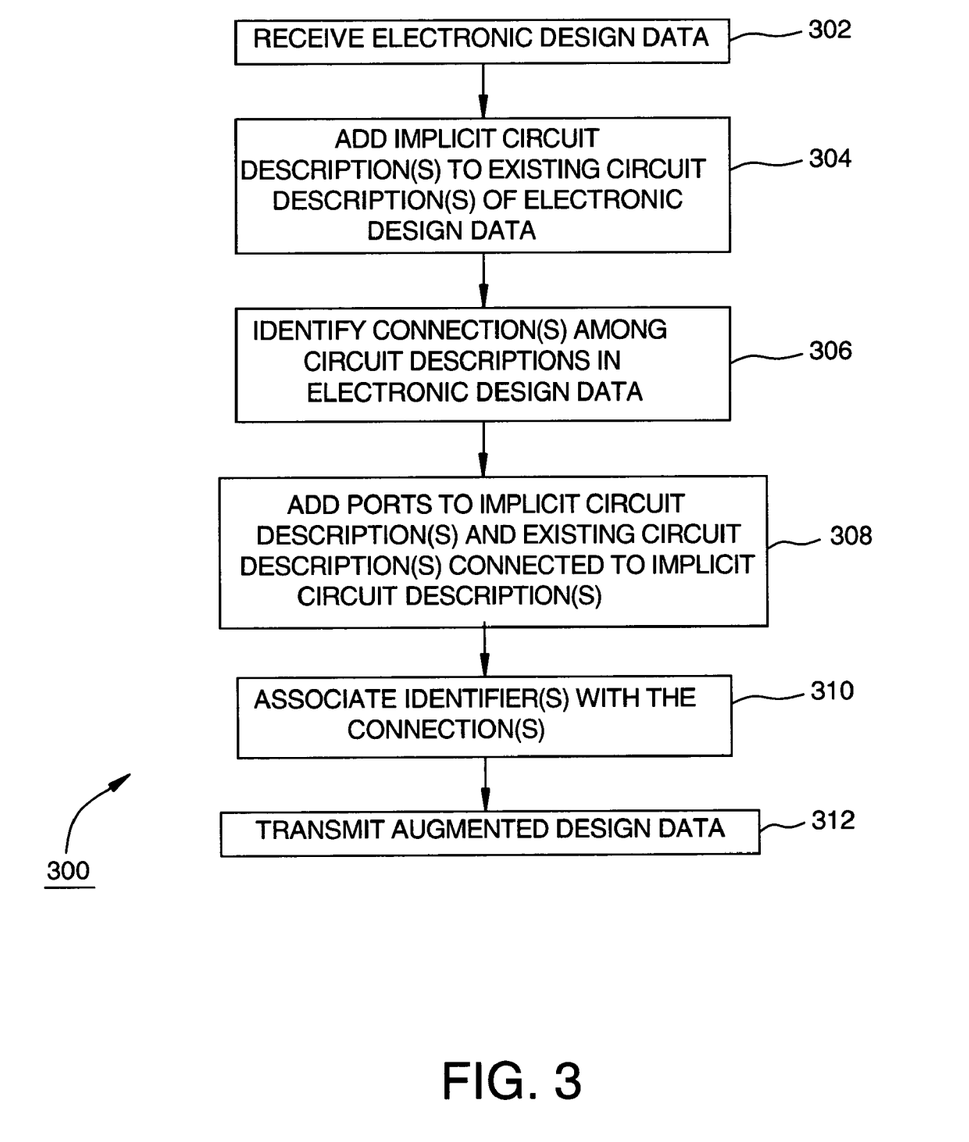
FIG. 3 is a flow diagram depicting an exemplary embodiment of a process for facilitating the translation of an electronic design of an integrated circuit into circuit description language.

Augmentation section 210 receives electronic design data 206. Augmentation section 210 executes a process 300 to augment electronic design data 206 to facilitate translation of electronic design data 206 into a circuit description language representation (e.g., an HDL representation). Process 300 is described in more detail below. Notably, since electronic design data 206 is an abstraction of IC design 204, some circuit descriptions may be "implicit" within electronic design data 206. That is, some circuit descriptions may be hidden from the user, but are nevertheless required to produce functioning hardware from IC design 204. For example, electronic design data 206 may not explicitly include a clock driver circuit and clock ports on each of the synchronously operated circuit elements. Augmentation section 210 produces augmented design data 214.

Figure 4:
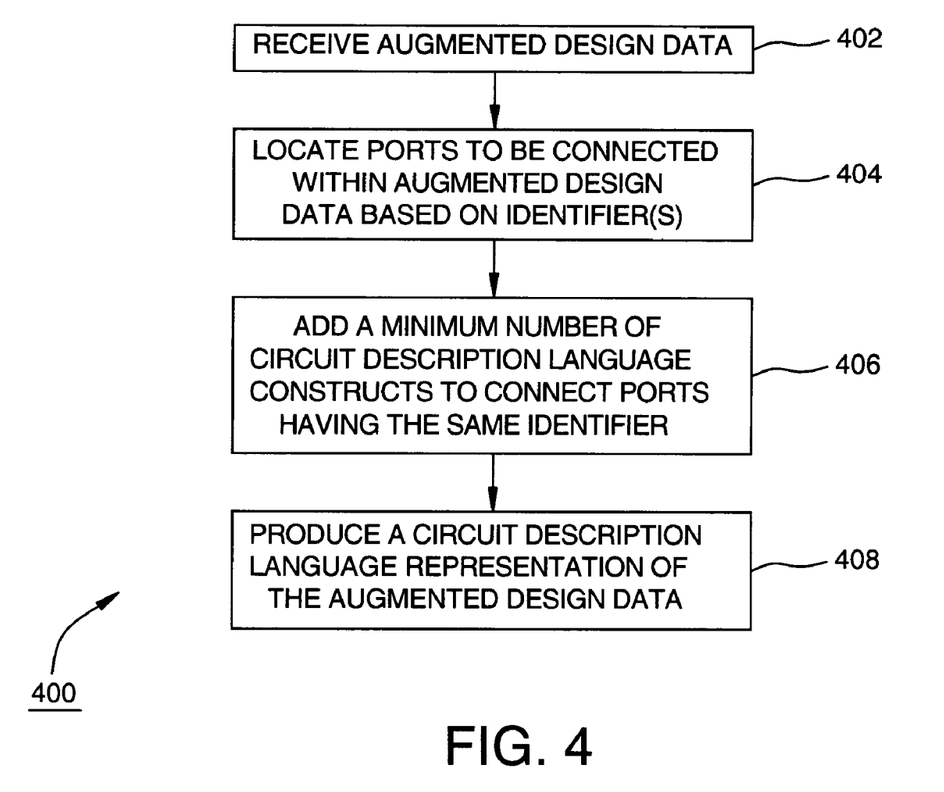
FIG. 4 is a flow diagram depicting an exemplary embodiment of a process for translating an electronic design of an integrated circuit into circuit description language.

Translation section 216 receives augmented design data 214. Translation section 216 executes a process 400 for translating augmented design data 214 into a circuit description language representation. Process 400 is described in detail below. Translation section 216 produces circuit description language data 218 (e.g., an HDL representation, such as VHDL or Verilog). Synthesizer 220 receives circuit description language data 218 and synthesizes the code to create a netlist 222 that can be implemented within hardware with placement and routing. The synthesis process is well-known in the art.

FIG. 3 is a flow diagram depicting an exemplary embodiment of a process 300 for facilitating the translation of an electronic design of an integrated circuit into circuit description language. Process 300 begins at step 302, where electronic design data is received. At step 304, one or more implicit circuit descriptions are added to the one or more existing circuit descriptions of the electronic design data. At step 306, one or more connections among the circuit descriptions of the electronic design data are identified. Such connections may be between existing circuit descriptions, or between implicit circuit descriptions, or between an implicit circuit description and an existing circuit description.

At step 308, ports are added to implicit circuit descriptions and to explicit circuit descriptions connected to implicit circuit descriptions. For example, if an implicit circuit description is added to the electronic design data, a connection between the newly added implicit circuit description and an existing circuit description may be required. As such, the existing circuit description requires a new port to accept the connection from the implicit circuit description. At step 310, identifiers are associated with the connections identified at step 306. At step 312, augmented design data is produced.

FIG. 4 is a flow diagram depicting an exemplary embodiment of a process 400 for translating an electronic design of an integrated circuit into circuit description language. Process 400 begins at step 402, where augmented design data is received. At step 404, ports to be connected within the augmented design data are located based on assigned identifiers. At step 406, a minimum number of circuit description language constructs are added to connect ports having the same identifier. At step 408, a circuit description language representation of the augmented design data is produced.

Figure 5A:
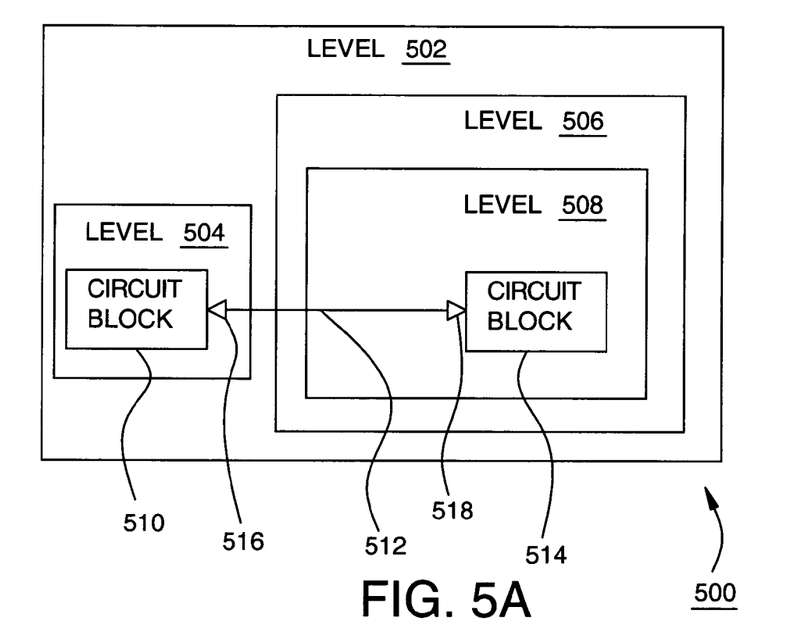
FIG. 5A is a block diagram depicting an exemplary embodiment of a portion of an electronic design.
Figure 5B:
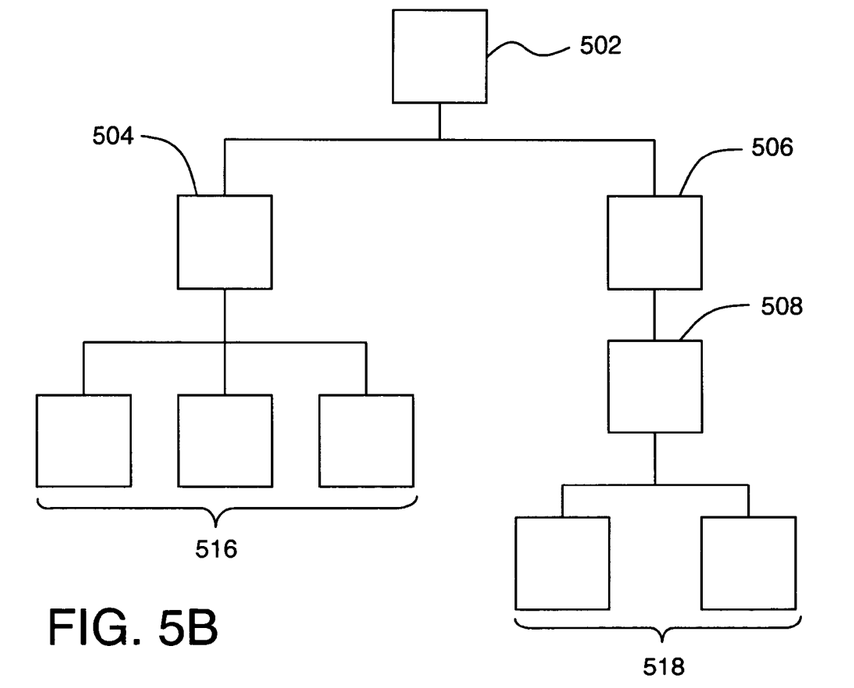
FIG. 5B is a block diagram depicting the hierarchical configuration of the electronic design portion of FIG. 5A.

Process 300 of FIG. 3 and process 400 of FIG. 4 may be more thoroughly understood with reference to the following examples. FIG. 5A is a block diagram depicting an exemplary embodiment of a portion 500 of an electronic design. FIG. 5B is a block diagram depicting the hierarchical configuration of the portion 500. The present example may be understood with simultaneous reference to FIG. 5A and FIG. 5B. Portion 500 includes multiple levels of hierarchy, illustratively, levels 502 through 508. Level 502 is the "root" level of portion 500. Level 504 and Level 506 are "children" levels of the level 502. Likewise, level 508 is a child level of the level 506. Portion 500 may have additional levels, such as levels 516, which are children of level 504, and levels 518, which are children of level 508.

Level 508 includes a circuit block 514, and level 504 includes a circuit block 510. Circuit block 510 is connected to circuit block 514 via a connection 512. Notably, a port 516 of circuit block 510 is connected to a port 518 of circuit block 514. As shown, the connection spans multiple levels of hierarchy, namely, from level 504 up to level 502, then down through level 506 to level 508.

To translate portion 500 into a circuit description language representation, augmentation process 300 is first executed with portion 500 as parametric input. In the present example, it is assumed that no implicit circuit descriptions are required for portion 500. An example having implicit circuit descriptions is described below with respect to FIG. 6. Connection 512 is identified and associated with a particular identifier. Note that no new ports are required to be added, since there are no implicit circuit descriptions.

Next, translation process 400 is executed with the augmented design data as parametric input. Ports 516 and 518 that are connected via connection 512 are located within the augmented data using the assigned identifier above. Ports 516 and 518 are then connected within a circuit description language representation by adding a minimum number of circuit description language constructs to bridge connection 512. In the present example, circuit description language constructs must be added to level 508, level 506, level 502, and level 504. In general, a circuit component in a first level is connected to a circuit component in a second level by adding circuit description language constructs up through the hierarchy to a common level of the first and second levels. In this manner, circuit block 510 is connected to circuit block 514 within a circuit description language representation. The connection, which straddles multiple levels of hierarchy within the design, is facilitated by the use of an identifier for the connection. Furthermore, using an identifier for the connection allows circuit block 510 and circuit block 514 to be placed anywhere within the hierarchy of the portion 500 without intervention by the user.

Figure 6A:
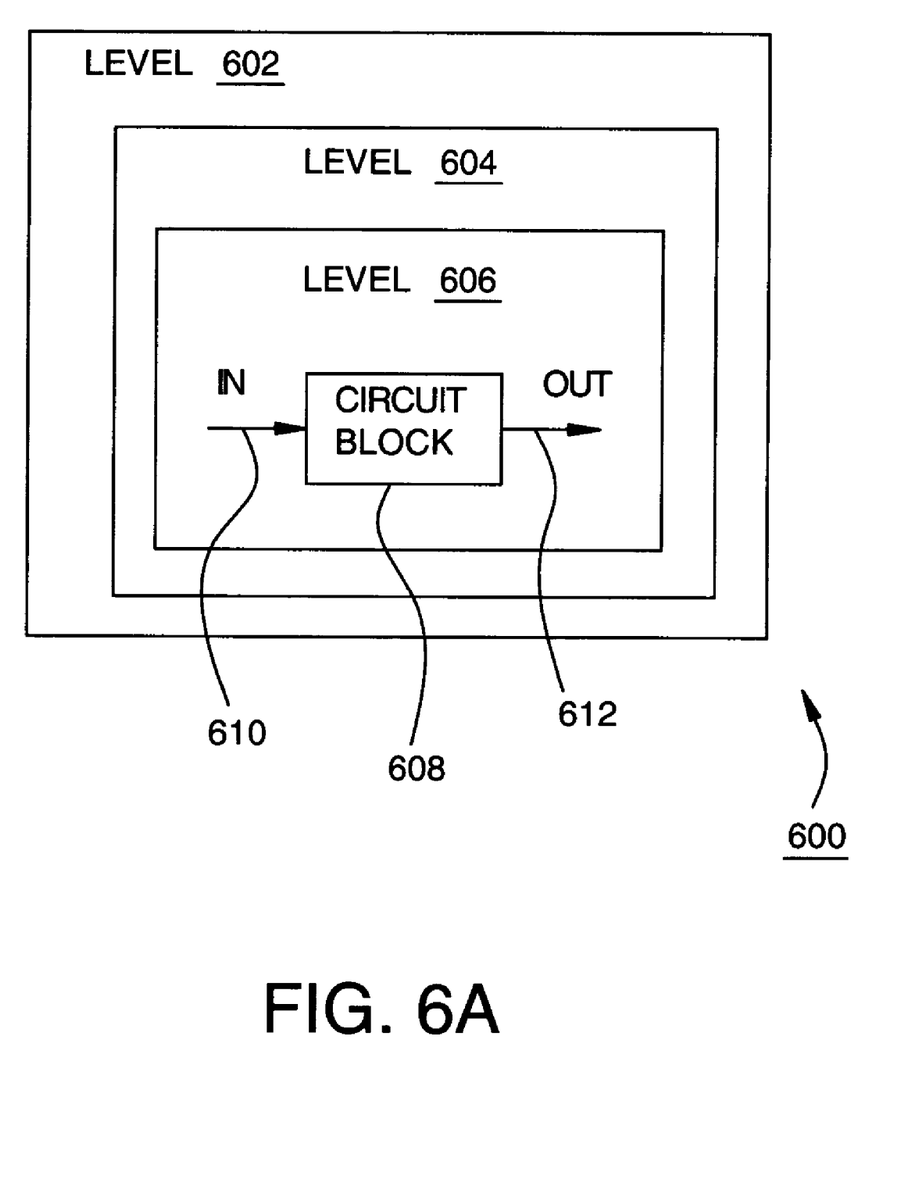
FIG. 6A is a block diagram depicting another exemplary embodiment of a portion of an electronic design.

FIG. 6A is a block diagram depicting another exemplary embodiment of a portion 600 of an electronic design. Portion 600 includes multiple levels of hierarchy, illustratively, levels 602 through 606. Level 602 is the root level of portion 600. Level 604 is a child of level 602, and level 606 is a child of level 604. Level 606 includes a circuit block 608. Circuit block 608 includes an input port 610 and an output port 612.

Figure 6B:
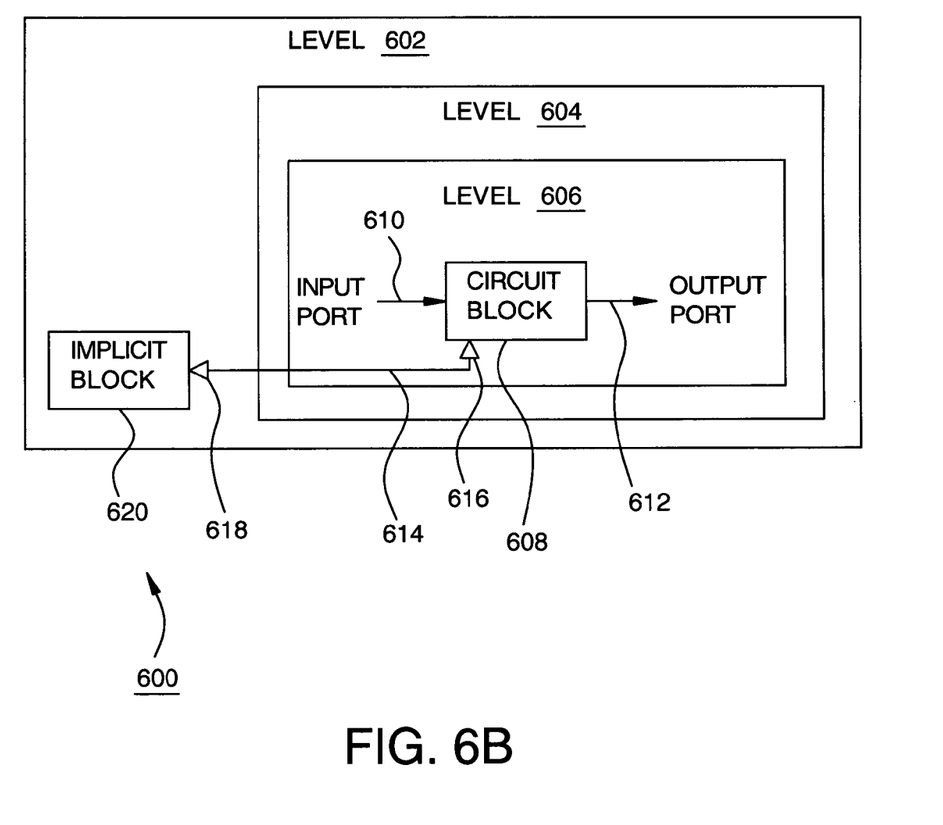
FIG. 6B is a block diagram depicting an exemplary embodiment of the electronic design portion of FIG. 6A augmented by the process of FIG. 3.

FIG. 6B is a block diagram depicting an exemplary embodiment of portion 600 augmented by augmentation process 300. An implicit circuit block 620 is added to level 602 of portion 600. A connection 614 between implicit circuit block 620 and circuit block 608 is required and identified. Since implicit circuit block 620 has been added to portion 600, and was not explicit in the original design, a port 618 is added to implicit circuit block 620 and a port 616 is added to circuit block 608. Ports 616 and 618 are required to support connection 614. An identifier is then associated with connection 614. As described above, the identifier will be used to facilitate connection of circuit block 608 to circuit block 620 within a circuit description language representation of portion 600, and allows implicit block 620 and circuit block 608 to be moved throughout the hierarchy of portion 600 before final translation.

For example, an HLMS may provide a down sampler block that allows a user to specify a phase offset at which the down sampler block samples its input. The user may specify the phase offset in a configuration field associated with the down sampler block. In hardware, the phase offset may be realized by making a signal in a clock driver circuit available to the down sampler block. Due to abstraction, however, the clock driver may not be explicit within a design incorporating the down sampler. Such a design may be augmented to provide the clock driver and then translated into a circuit description language representation.

Notably, a clock driver block is created within the top level of the design having the down sampler block. A port is created on the clock driver block to supply a signal to the down sampler block, and a port is created on the down sampler block to receive the signal from the clock driver block. The ports are then connected using a connection that is assigned a particular identifier. The clock driver block may then be connected to the down sampler block during translation of the design into circuit description language using the identifier, as described above.

In order to understand more specifically the down sampler block example given above, reference is made to the appendix, which is herein incorporated by reference in its entirety. The VHDL code in the Appendix is an illustrative example of a circuit description language representation of an augmented design of a down sampler. The Appendix includes three levels of hierarchy, named top, middle, and bottom. Top contains two components: middle and a clock driver. Middle contains bottom, and bottom contains the down sampler block named down_sample. To deliver a phase signal from the clock driver to the down sampler block, the processes 300 and 400 (FIGS. 3–4) adds in the top entity/architecture an abstract output port to the clock driver (shown by the underlined text "phase:outstdlogic;" in the component clock_driver), and an abstract input port to the down sampler driver (shown by the underlined text "phase:instdlogic;" in the component middle). The processes then connect the abstract ports using an abstract connection (shown by the underlined text "signal phasex0:stdlogic;". The connection is shown in the instantiations of the clock_driver component "clock_driver_x_0" (the port mapping "phase=>phase_x_0) and of the middle component "middle_x_1" (the port mapping "phase=>phase_x_0). The VHDL code that is added to the middle level and bottom level entity/architecture pairs are shown in the Appendix by underlined text. As can be seen the connection name "phase_x_0" assigned at the top level represents the phase connection of the clock driver at the top level to the down sampler in the bottom level and hence is hierarchically independent indication.

The Appendix illustrates that one way to make the abstract connection is to assign the connection a name, e.g., "phase_x_0", then to tag the abstract ports with the name (e.g., "port map (phase=>phase_x_0, . . . ). Other approaches are possible. The only thing that is essential is that the two ports are identified as needing to be connected. Note that the abstract connection is independent of the particular locations in the hierarchy of the clock driver or the down sampler, and is independent of the particular ways that connections may be made in VHDL.

Translation of an electronic design of an integrated circuit into circuit description language has been described. In an embodiment, the following mechanisms are employed when compiling, i.e., when translating a high level HLMS design into hardware: a software mechanism that allows abstract blocks to be created, and allows the set of ordinary blocks from the original design to be augmented with abstract blocks; a software mechanism that allows abstract ports to be created, and allows blocks to be augmented with abstract ports; a software mechanism that represents abstract connections, and allows abstract connections between ports; and a software mechanism that translates abstract connections into concrete ones. An abstract block is one that is not present in the original design but must be present in hardware. For example, the compiler can add a clock driver as abstract block. In the high level design, clocks are only present implicitly, but in hardware an explicit clock driver must be present.

Similarly, an abstract port is one that is not visible in the high level version of an HLMS design, but is adjoined when compiling so that it becomes a genuine port in hardware. Clock and clock enable ports are examples of abstract ports; they are required in hardware, but are only implicit in a high level HLMS design. An abstract connection indicates that ports must be connected but does not specify how they are connected. In an embodiment, abstract connections are represented with names; when several ports must be connected, a name representing the set is chosen, and each port is tagged with the name. The locations of the ports in the design hierarchy are immaterial. To produce working hardware, each abstract connection must be made real. The compiler accomplishes this by adding a minimal set of ports to the design hierarchy to allow the connection to be bridged, and then adds hardware nets that connects the original and added ports to one another.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

Appendix

```
entity top is
  port (
    clk: in std_logic;
    din: in std_logic_vector(7 downto 0);
    dout: out std_logic_vector(7 downto 0)
  );
end top;
architecture structural of top is
  component clock_driver
  port (
    clk: in std logic;
    ce1: in std_logic;
    phase:outstd_logic;
    ce2: out std_logic
  );
  end component;
  component middle
  port (
    clk: in std logic;
    ce1: in std logic;
    ce2: in std_logic;
    phase:instdlogic;
    din: in std_logic_vector(7 downto 0);
    dout: out std_logic vector(7 downto 0)
  );
  end component;
  signal ce1_x_0: std_logic;
  signal ce2_x_0: std_logic;
  signalphase_x_0:std_logic;
begin
  clock_driver_x_0: clock_driver
  port map (
    phase=>phase_x_0,
    clk=>clk,
    ce1=>ce1_x_0,
    ce2=>ce2_x_0
  );
  middle_x_1: middle
  port map (
    phas=>phase_x_0,
    clk=>clk,
    ce1=>ce1_x_0,
    ce2=>ce2_x_0,
    din=>din,
    dout=>dout
  );
end structural;
entity middle is
  port (
    clk: in std_logic;
    ce1: in std_logic;
    ce2: in std_logic;
    phase:instd_logic;
    din: in std_logic_vector(7 downto 0);
    dout: out std_logic_vector(7 downto 0)
  );
end middle;
architecture structural of middle is
  component bottom
  port (
    clk: in std_logic;
    ce1: in std logic;
    ce2: in std_logic;
    phase:instdlogic;
    din: in std_logic_vector(7 downto 0);
    dout: out std_logic_vector(7 downto 0)
  );
  end component;
begin
  bottom_x_0: bottom
  port map (
    phase=>phase,
    clk=>clk,
    ce1=>ce1,
    ce2=>ce2,
    din=>din,
    dout=>dout
  );
end structural;
entity bottom is
  port (
    clk: in std_logic;
    ce1: in std_logic;
    ce2: in std_logic;
    phase:instdlogic;
    din: in std_logic_vector(7 downto 0);
    dout: out std_logic vector(7 downto 0)
  );
end bottom;
architecture structural of bottom is
  component xldsamp
  port (
```

```
clk: in std_logic;
src_ce: in std_logic;
dest_ce: in std_logic;
phase:instdlogic;
d: in std_logic_vector(7 downto 0);
q: out std_logic_vector(7 downto 0)
);
end component;

begin
    down_sample: xldsamp
    port map (
    clk=>clk,
    src_ce=>ce1,
    dest_ce=>ce2,
    phase=>phase,
    d=>din,
    q=>dout
    );
end structural;
```

The invention claimed is:

1. A method of translating an electronic design representation of an integrated circuit into circuit description language, comprising:
   identifying a connection among circuit descriptions representing behavior of circuit elements in the electronic design representation;
   associating an identifier with the connection; and
   translating the electronic design representation into a circuit description language representation, where the connection is implemented within the circuit description language representation using the identifier.

2. The method of claim 1, further comprising repeating the identifying and the associating for additional connections, wherein the additional connections are implemented within the circuit description language representation using respective identifiers.

3. The method of claim 1, wherein the associating comprises relating ports associated with the connection to the identifier.

4. The method of claim 3, wherein the circuit elements are organized over levels of hierarchy, and wherein the connection among the ports spans a plurality of the levels of hierarchy.

5. The method of claim 4, wherein the circuit description language representation is organized over levels of hierarchy, and wherein the translating comprises:
   locating ports to be connected within the electronic design representation based on the identifier; and
   adding constructs to a plurality of the levels of hierarchy of the circuit description language representation to effect the connection among the ports located.

6. A method of translating an electronic design representation of an integrated circuit into circuit description language, comprising:
   identifying an implicit circuit description representing behavior of a first portion of circuit elements within the electronic design representation;
   augmenting explicit circuit descriptions representing behavior of a second portion of circuit elements within the electronic design representation with an additional circuit description; and
   translating the electronic design representation into a circuit description language representation.

7. The method of claim 6, wherein the augmenting comprises:
   identifying a connection among the implicit circuit description and at least one of the explicit circuit descriptions;
   adding ports to the implicit circuit description and the at least one of the explicit circuit descriptions responsive to the connection; and
   associating an identifier with the ports added.

8. The method of claim 7, wherein the translating comprises
   locating at least two ports to be connected within the electronic design representation based on the identifier; and
   adding constructs to the circuit description language representation to effect the connection among the at least two ports.

9. The method of claim 8, wherein the explicit circuit descriptions and the implicit circuit description are organized over levels of hierarchy within the electronic design representation, and wherein the connection spans a plurality of the levels of hierarchy.

10. The method of claim 6, further comprising repeating the identifying and the augmenting for at least one additional implicit circuit description.

11. An apparatus for translating an electronic design representation of an integrated circuit into circuit description language, comprising:
    means for identifying an implicit circuit description representing behavior of a first portion of circuit elements within the electronic design representation;
    means for augmenting explicit circuit descriptions representing behavior of a second portion of circuit elements within the electronic design representation with an additional circuit description; and
    means for translating the electronic design representation into a circuit description language representation.

12. The apparatus of claim 11, wherein the means for augmenting comprises:
    means for identifying a connection among the implicit circuit description and at least one of the explicit circuit descriptions;
    means for adding ports to the implicit circuit description and the at least one of the explicit circuit descriptions responsive to the connection; and
    means for associating an identifier with the ports added.

13. A computer readable medium having stored thereon instructions that, when executed by a processor, cause the processor to perform a method of the method of translating an electronic design representation of an integrated circuit into circuit description language, the method comprising:
    identifying an implicit circuit description representing behavior of a first portion of circuit elements within the electronic design representation;
    augmenting explicit circuit descriptions representing behavior of a second portion of circuit elements within the electronic design representation with an additional circuit description; and
    translating the electronic design representation into a circuit description language representation.

14. The computer readable medium of claim 13, wherein the augmenting comprises:
    identifying a connection among the implicit circuit description and at least one of the explicit circuit descriptions;

adding ports to the implicit circuit description and the at least one of the explicit circuit descriptions responsive to the connection; and associating an identifier with the ports added.

15. A system for translating an electronic design representation of an integrated circuit into circuit description language, the system comprising:

a processing unit having access to one or more storage devices;

at least a portion of the one or more storage devices having a plurality of circuit descriptions representing behavior of circuit elements of the electronic design representation;

at least another portion of the one or more storage devices having a program product configured to:

identify an implicit circuit description within the electronic design representation;

augment explicit circuit descriptions within the electronic design representation with an additional circuit description; and translate the electronic design representation into a circuit description language representation.

16. The system of claim 15, wherein the program product is further configured to:

identify a connection among the implicit circuit description and at least one of the explicit circuit descriptions;

add ports to the implicit circuit description and the at least one of the explicit circuit descriptions responsive to the connection; and associate an identifier with the ports added.

17. The system of claim 16, wherein the program product is further configured to:

locate at least two ports to be connected within the electronic design representation based on the identifier; and add constructs to the circuit description language representation to effect the connection among the at least two ports.

18. A system for translating an electronic design representation of an integrated circuit into circuit description language, the system comprising:

an input section for providing electronic design data responsive to the electronic design representation;

an augmentation section, in communication with the input section, for identifying an implicit circuit description within the electronic design data and augmenting explicit circuit descriptions within the electronic design data with an additional circuit description; and a translation section, in communication with the augmentation section, for translating the electronic design data into a circuit description language representation.

19. The system of claim 18, wherein the translation section is further configured to:

identify a connection among the implicit circuit description and at least one of the explicit circuit descriptions;

add ports to the implicit circuit description and the at least one of the explicit circuit descriptions responsive to the connection; and associate an identifier with the ports added.

20. The system of claim 19, wherein the translation section is further configured to:

locate at least two ports to be connected within the electronic design representation based on the identifier; and add constructs to the circuit description language representation to effect the connection among the at least two ports.

21. A method for producing a circuit description language representation of an electronic design of an integrated circuit, comprising:

identifying a plurality of ports which need to be connected together;

associating with a first port of the plurality of ports a hierarchically independent indication that the first port is connected to a second port of the plurality of ports; and connecting the first port to the second port in the circuit description language representation using the hierarchically independent indication.

22. The method of claim 21 further comprising associating with the second port of the plurality of ports the hierarchically independent indication.

23. The method of claim 22 wherein the hierarchically independent indication comprises a global identifier of the connection between the first port and the second port.

* * * * *